(12) United States Patent
Aitken et al.

(10) Patent No.: US 9,050,622 B2
(45) Date of Patent: Jun. 9, 2015

(54) METHOD FOR INHIBITING OXYGEN AND MOISTURE DEGRADATION OF A DEVICE AND THE RESULTING DEVICE

(71) Applicant: CORNING INCORPORATED, Corning, NY (US)

(72) Inventors: Bruce Gardiner Aitken, Corning, NY (US); Mark Alan Lewis, Horseheads, NY (US); Mark Alejandro Quesada, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/223,380

(22) Filed: Mar. 24, 2014

(65) Prior Publication Data

US 2014/0234542 A1  Aug. 21, 2014

Related U.S. Application Data

(62) Division of application No. 11/207,691, filed on Aug. 18, 2005.

(51) Int. Cl.
*B05D 5/00* (2006.01)
*C03C 3/12* (2006.01)
(Continued)

(52) U.S. Cl.
CPC . *B05D 5/00* (2013.01); *C03C 3/122* (2013.01); *C03C 3/14* (2013.01); *C03C 3/247* (2013.01); *H01L 51/5253* (2013.01)

(58) Field of Classification Search
CPC ............. B05D 5/00; C03C 3/122; C03C 3/14
See application file for complete search history.

(56) References Cited

U.S. PATENT DOCUMENTS 3,622,439 A  11/1971  Manne et al. .................. 161/184
3,720,097 A   3/1973  Kron ................................ 73/55

(Continued)

FOREIGN PATENT DOCUMENTS

DE  2431917  1/1976
EP  0225164  6/1987  ......................... 27/34

(Continued)

OTHER PUBLICATIONS

N. Regnier et al., "Solid-State 13C-NMR Study on Bismalcimide/Diamine Polymerization: Structure, Control of Particle Size, and Mechanical Properties", Journal of Applied Polymer Science, vol. 78, 2000, pp. 23792388.

(Continued)

*Primary Examiner* — Elmito Breval
(74) *Attorney, Agent, or Firm* — Ryan T. Hardee

(57) ABSTRACT

A method for inhibiting oxygen and moisture degradation of a device and the resulting device are described herein. To inhibit the oxygen and moisture degradation of the device, a low liquidus temperature (LLT) material which typically has a low low liquidus temperature (or in specific embodiments a low glass transition temperature) is used to form a barrier layer on the device. The LLT material can be, for example, tin fluorophosphate glass, chalcogenide glass, tellurite glass and borate glass. The LLT material can be deposited onto the device by, for example, sputtering, evaporation, laser-ablation, spraying, pouring, frit-deposition, vapor-deposition, dip-coating, painting or rolling, spin-coating or any combination thereof. Defects in the LLT material from the deposition step can be removed by a consolidation step (heat treatment), to produce a pore-free, gas and moisture impenetrable protective coating on the device. Although many of the deposition methods are possible with common glasses (i.e. high melting temperature glasses like borate silicate, silica, etc.), the consolidation step is only practical with the LLT material where the consolidation temperature is sufficiently low so as to not damage the inner layers in the device.

12 Claims, 5 Drawing Sheets

(51) Int. Cl.
*C03C 3/14* (2006.01)
*C03C 3/247* (2006.01)
*H01L 51/52* (2006.01)

(56) References Cited

U.S. PATENT DOCUMENTS

| | | | |
|---|---|---|---|
| 3,795,976 A | 3/1974 | Ikeda | |
| 3,916,048 A | 10/1975 | Walles | 428/35 |
| 3,932,693 A | 1/1976 | Shaw et al. | 428/518 |
| 4,040,874 A | 8/1977 | Yerman | |
| 4,077,588 A | 3/1978 | Hurst | 244/31 |
| 4,314,031 A | 2/1982 | Sanford et al. | 501/44 |
| 4,374,391 A | 2/1983 | Camlibel et al. | 357/17 |
| 4,379,070 A | 4/1983 | Tick | 252/301.16 |
| 4,702,963 A | 10/1987 | Phillips et al. | 428/426 |
| 4,740,412 A | 4/1988 | Hocker et al. | 428/194 |
| 4,802,742 A | 2/1989 | Ichikawa et al. | 350/339 |
| 4,859,513 A | 8/1989 | Gibbons et al. | 428/34.2 |
| 5,084,356 A | 1/1992 | Deak et al. | 428/458 |
| 5,089,446 A | 2/1992 | Cornelius et al. | |
| 5,110,637 A | 5/1992 | Ando et al. | 428/34 |
| 5,110,668 A | 5/1992 | Minnick | 428/215 |
| 5,180,476 A | 1/1993 | Ishibashi et al. | 204/192.29 |
| 5,183,684 A | 2/1993 | Carpenter | 427/574 |
| 5,211,995 A | 5/1993 | Kuehnle et al. | 427/570 |
| 5,324,572 A | 6/1994 | Kuechler et al. | 428/215 |
| 5,407,713 A | 4/1995 | Wilfong et al. | 428/34.1 |
| 5,462,779 A | 10/1995 | Misiano et al. | 428/34.7 |
| 5,478,618 A | 12/1995 | Rosen | 428/35.4 |
| 5,567,488 A | 10/1996 | Allen et al. | 428/34.1 |
| 5,610,742 A | 3/1997 | Hinata et al. | 349/122 |
| 5,641,559 A | 6/1997 | Namiki | 408/216 |
| 5,645,923 A | 7/1997 | Matsuo et al. | 428/216 |
| 5,736,207 A | 4/1998 | Walther et al. | 428/34.7 |
| 5,792,550 A | 8/1998 | Phillips et al. | 428/336 |
| 5,900,285 A | 5/1999 | Walther et al. | 427/491 |
| 6,077,928 A | 6/2000 | Suh et al. | 528/170 |
| 6,083,313 A | 7/2000 | Venkatraman et al. | 106/287.14 |
| 6,162,892 A | 12/2000 | Kobayashi et al. | 528/310 |
| 6,171,663 B1 | 1/2001 | Hanada et al. | 428/1 |
| 6,171,703 B1 | 1/2001 | Haluska | 428/446 |
| 6,193,379 B1 | 2/2001 | Tonar et al. | 359/603 |
| 6,207,488 B1 | 3/2001 | Hwang et al. | 438/240 |
| 6,211,560 B1 | 4/2001 | Jimenez et al. | 257/451 |
| 6,235,579 B1 | 5/2001 | Lou | 438/253 |
| 6,244,441 B1 | 6/2001 | Ahlgren | 206/522 |
| 6,249,014 B1 | 6/2001 | Bailey | 257/295 |
| 6,268,695 B1 | 7/2001 | Affinito | 313/504 |
| 6,271,150 B1 | 8/2001 | Croswell et al. | 438/760 |
| 6,288,415 B1 | 9/2001 | Leong et al. | 257/94 |
| 6,294,420 B1 | 9/2001 | Tsu et al. | 438/239 |
| 6,306,783 B1 | 10/2001 | Yamanaka | 501/15 |
| 6,321,571 B1 | 11/2001 | Themont et al. | 65/155 |
| 6,350,529 B1 | 2/2002 | Germain et al. | 428/476.3 |
| 6,355,125 B1 | 3/2002 | Tahon et al. | 156/99 |
| 6,403,176 B1 | 6/2002 | Patouraux et al. | 428/35.2 |
| 6,413,645 B1 | 7/2002 | Graff et al. | 428/446 |
| 6,465,101 B1 | 10/2002 | MacGregor et al. | 428/412 |
| 6,486,549 B1 | 11/2002 | Chiang | 257/723 |
| 6,492,026 B1 | 12/2002 | Graff et al. | 428/411.1 |
| 6,522,067 B1 | 2/2003 | Graff et al. | 313/512 |
| 6,524,698 B1 | 2/2003 | Schmoock | 428/336 |
| 6,528,442 B1 | 3/2003 | Kuwano et al. | 501/41 |
| 6,530,477 B1 | 3/2003 | Martorano et al. | 206/524.2 |
| 6,623,861 B2 | 9/2003 | Martin et al. | 428/412 |
| 6,635,989 B1 | 10/2003 | Nilsson et al. | 313/512 |
| 6,660,409 B1 | 12/2003 | Komatsu et al. | 428/690 |
| 6,664,730 B2 | 12/2003 | Weaver | 313/504 |
| 6,720,097 B2 | 4/2004 | Ohkawa et al. | 428/701 |
| 6,720,203 B2 | 4/2004 | Carcia et al. | 438/99 |
| 6,740,394 B2 | 5/2004 | Jacobsen et al. | 428/216 |
| 6,740,430 B2 | 5/2004 | Ueno et al. | 428/690 |
| 6,866,901 B2 | 3/2005 | Burrows et al. | 428/1.5 |
| 6,873,101 B2 | 3/2005 | Nilsson et al. | 313/512 |
| 6,991,506 B2 | 1/2006 | Yamada et al. | 445/24 |
| 7,015,640 B2 | 3/2006 | Schaepkens et al. | 313/506 |
| 7,034,457 B2 | 4/2006 | Iwase et al. | 313/512 |
| 7,045,951 B2 | 5/2006 | Kawase et al. | 313/504 |
| 7,126,269 B2 | 10/2006 | Yamada | 313/504 |
| 7,169,003 B2 | 1/2007 | Iwase et al. | 445/23 |
| 7,198,832 B2 | 4/2007 | Burrows et al. | 428/1.5 |
| 1,615,506 A1 | 11/2009 | Aitken et al. | 501/44 |
| 7,923,115 B2 | 4/2011 | Nagai et al. | 428/426 |
| 2001/0005585 A1 | 6/2001 | Ashihara et al. | 435/7.95 |
| 2001/0013756 A1 | 8/2001 | Mori et al. | 313/512 |
| 2001/0033135 A1 | 10/2001 | Duggal et al. | 313/506 |
| 2001/0038894 A1 | 11/2001 | Komada | 428/34.6 |
| 2001/0054436 A1 | 12/2001 | Mukai et al. | 136/256 |
| 2002/0013042 A1 | 1/2002 | Morkoc | 438/604 |
| 2002/0019303 A1 | 2/2002 | Yamanaka | 501/17 |
| 2002/0037418 A1 | 3/2002 | Peiffer et al. | 428/458 |
| 2002/0041443 A1 | 4/2002 | Varaprasad et al. | 359/603 |
| 2002/0074553 A1 | 6/2002 | Starikov et al. | 257/77 |
| 2002/0076154 A1 | 6/2002 | Maisenhoelder et al. | 385/37 |
| 2002/0110692 A1 | 8/2002 | Suzuki et al. | 428/411.1 |
| 2002/0114937 A1 | 8/2002 | Albert et al. | 428/304.4 |
| 2002/0122649 A1 | 9/2002 | Shimizu et al. | 385/129 |
| 2002/0127341 A1 | 9/2002 | Li | 427/385.5 |
| 2002/0140347 A1 | 10/2002 | Weaver | 313/506 |
| 2002/0142116 A1 | 10/2002 | Jud et al. | 428/35.3 |
| 2002/0160137 A1 | 10/2002 | Varma | 428/35.7 |
| 2002/0180924 A1 | 12/2002 | Sobrinho | 349/158 |
| 2003/0000826 A1 | 1/2003 | Krempel-Hesse et al. | 204/173 |
| 2003/0006697 A1 | 1/2003 | Weaver | 313/503 |
| 2003/0019517 A1 | 1/2003 | McFarland | 136/256 |
| 2003/0020099 A1 | 1/2003 | Taylor | 257/215 |
| 2003/0022919 A1 | 1/2003 | Ayers et al. | 512/317 |
| 2003/0032039 A1 | 2/2003 | Cunningham et al. | 435/6 |
| 2003/0044552 A1 | 3/2003 | Komada | 428/35.7 |
| 2003/0047353 A1 | 3/2003 | Yamaguchi et al. | 174/260 |
| 2003/0049942 A1 | 3/2003 | Haukka et al. | 438/778 |
| 2003/0068534 A1 | 4/2003 | Ohkawa et al. | 428/701 |
| 2003/0075753 A1 | 4/2003 | Chu et al. | 257/308 |
| 2003/0080678 A1 | 5/2003 | Kim et al. | 313/504 |
| 2003/0085652 A1 | 5/2003 | Weaver | 313/506 |
| 2003/0087513 A1 | 5/2003 | Noguchi et al. | 438/627 |
| 2003/0143423 A1 | 7/2003 | McCormick et al. | 428/690 |
| 2003/0152803 A1 | 8/2003 | Acchione | 428/690 |
| 2003/0155151 A1 | 8/2003 | Hermanns et al. | 174/260 |
| 2003/0155860 A1 | 8/2003 | Choi et al. | 313/498 |
| 2003/0165696 A1 | 9/2003 | Namiki et al. | 428/446 |
| 2003/0183915 A1 | 10/2003 | Scheifers et al. | 257/682 |
| 2003/0184219 A1 | 10/2003 | Duggal et al. | 313/506 |
| 2003/0192587 A1 | 10/2003 | Guzman et al. | |
| 2003/0193057 A1 | 10/2003 | Humbs et al. | 257/88 |
| 2003/0193286 A1 | 10/2003 | Ottermann et al. | 313/506 |
| 2003/0197197 A1 | 10/2003 | Brown et al. | 257/200 |
| 2003/0203210 A1 | 10/2003 | Graff | 428/412 |
| 2003/0207500 A1 | 11/2003 | Pichler et al. | 438/127 |
| 2003/0214612 A1 | 11/2003 | Freeman | 349/12 |
| 2003/0219632 A1 | 11/2003 | Schaepkens | 428/698 |
| 2003/0234180 A1 | 12/2003 | Shimizu et al. | 205/80 |
| 2004/0019596 A1 | 1/2004 | Taylor et al. | 707/100 |
| 2004/0021820 A1 | 2/2004 | Sobrinho | 349/158 |
| 2004/0033379 A1 | 2/2004 | Grunlan et al. | 428/515 |
| 2004/0043138 A1 | 3/2004 | Jagannathan et al. | 427/66 |
| 2004/0046497 A1 | 3/2004 | Schaepkens et al. | 313/506 |
| 2004/0046500 A1 | 3/2004 | Stegamat | 313/512 |
| 2004/0051449 A1 | 3/2004 | Klausmann et al. | 313/512 |
| 2004/0067604 A1 | 4/2004 | Ouellet et al. | 438/108 |
| 2004/0075382 A1 | 4/2004 | Stegamat et al. | 313/506 |
| 2004/0092095 A1 | 5/2004 | Nguyen et al. | 438/627 |
| 2004/0097005 A1 | 5/2004 | Daniels | 438/99 |
| 2004/0100176 A1 | 5/2004 | Pichler | 313/112 |
| 2004/0113542 A1 | 6/2004 | Hsiao et al. | 313/504 |
| 2004/0113543 A1 | 6/2004 | Daniels | 313/504 |
| 2004/0115361 A1 | 6/2004 | Aegerter et al. | 427/430.1 |
| 2004/0119403 A1 | 6/2004 | McCormick et al. | 313/506 |
| 2004/0121586 A1 | 6/2004 | Abell | 438/637 |
| 2004/0132606 A1 | 7/2004 | Wolf et al. | 501/66 |
| 2004/0135268 A1 | 7/2004 | Frischknecht | 257/788 |
| 2004/0135503 A1 | 7/2004 | Handa et al. | 313/511 |
| 2004/0140766 A1 | 7/2004 | Nilsson et al. | 313/512 |
| 2004/0151934 A1 | 8/2004 | Schwark et al. | 428/518 |

(56) References Cited

U.S. PATENT DOCUMENTS

| | | | |
|---|---|---|---|
| 2004/0157426 A1 | 8/2004 | Ouellet et al. | 438/618 |
| 2004/0166239 A1 | 8/2004 | Ohkawa et al. | 427/248.1 |
| 2004/0174115 A1 | 9/2004 | Czeremuszkin et al. | 313/504 |
| 2004/0195960 A1 | 10/2004 | Czeremuszkin et al. | 313/504 |
| 2004/0197489 A1 | 10/2004 | Heuser et al. | 427/535 |
| 2004/0201027 A1 | 10/2004 | Ghosh | 257/99 |
| 2004/0201348 A1 | 10/2004 | Anandan | 313/512 |
| 2004/0206953 A1 | 10/2004 | Morena et al. | 257/40 |
| 2004/0207314 A1 | 10/2004 | Aitken et al. | 313/504 |
| 2004/0209126 A1 | 10/2004 | Ziegler et al. | 428/702 |
| 2004/0229051 A1 | 11/2004 | Schaepkens et al. | 428/447 |
| 2004/0234797 A1 | 11/2004 | Schwark et al. | 428/474.4 |
| 2004/0239241 A1 | 12/2004 | Wittmann et al. | 313/511 |
| 2004/0258893 A1 | 12/2004 | Penttinen et al. | 428/212 |
| 2005/0012448 A1 | 1/2005 | Ke et al. | 313/504 |
| 2005/0045223 A1 | 3/2005 | Jenson et al. | 136/248 |
| 2005/0051763 A1 | 3/2005 | Affinito et al. | 257/3 |
| 2005/0241815 A1 | 11/2005 | Caze et al. | |
| 2005/0248272 A1 | 11/2005 | Koike et al. | 313/512 |
| 2006/0087230 A1 | 4/2006 | Ghosh et al. | |
| 2007/0252526 A1 | 11/2007 | Aitken et al. | 313/512 |

FOREIGN PATENT DOCUMENTS

| | | | |
|---|---|---|---|
| EP | 0135924 | 9/1987 | 27/8 |
| EP | 0151462 | 8/1990 | 27/32 |
| EP | 0288972 | 9/1993 | 27/34 |
| EP | 0394519 | 2/1994 | 1/133 |
| EP | 0588667 | 3/1994 | 27/32 |
| EP | 0638939 | 2/1995 | |
| EP | 0494594 | 10/1995 | 65/40 |
| EP | 0705757 | 4/1996 | 1/40 |
| EP | 0744285 | 12/1999 | 27/32 |
| EP | 0701897 | 4/2001 | 27/8 |
| EP | 1118459 | 7/2001 | 27/32 |
| EP | 1207572 | 5/2002 | |
| EP | 1278244 | 1/2003 | |
| EP | 0895013 | 8/2003 | 11/12 |
| EP | 0977469 | 9/2003 | |
| EP | 0726579 | 11/2003 | |
| EP | 0775328 | 3/2004 | |
| EP | 1420041 | 5/2004 | 7/4 |
| EP | 1442067 | 8/2004 | 18/76 |
| EP | 0787824 | 9/2004 | 16/40 |
| EP | 1410902 | 4/2006 | 27/34 |
| EP | 1965453 | 9/2008 | |
| JP | 2004/010843 | 1/2001 | C03C 8/14 |
| JP | 2003/020235 | 1/2003 | |
| JP | 2003/275575 | 9/2003 | |
| JP | 2004/018335 | 1/2004 | C03C 8/24 |
| JP | 2005/306010 | 11/2005 | |
| JP | 200607352 A | 3/2006 | |
| WO | WO 93/22131 | 11/1993 | |
| WO | WO 97/22536 | 6/1997 | 65/40 |
| WO | WO 99/19229 | 4/1999 | 65/42 |
| WO | WO 00/20536 | 4/2000 | |
| WO | WO 00/66794 | 11/2000 | 7/20 |
| WO | WO 01/05205 | 1/2001 | |
| WO | WO 01/65167 | 9/2001 | |
| WO | WO 01/83067 | 11/2001 | |
| WO | WO 02/36647 | 5/2002 | |
| WO | WO 03-087427 | 10/2003 | 183/4 |
| WO | WO 2004/046767 | 6/2004 | |
| WO | WO 2004/079781 | 9/2004 | |
| WO | WO 2004/094321 | 11/2004 | |
| WO | WO 2004/095597 | 11/2004 | |
| WO | WO 2004/105149 | 12/2004 | 51/10 |

OTHER PUBLICATIONS

MIT Internet Class 6.976, Lecture #7, "Special Topics in Flat Panel Display", Spring 2001, http://hackman.mit.edu\6976\LIIandouts\Lecture%207.pdf\.

J.E. White et al., "Polymerization of N,N'-bismaleimido-4,4'-diphenylmethane with arenedithiols. Synthesis of some new polyimidosulphides", Polymer, 1984, vol. 25, pp. 850-854.

Giefers, H. et al; (2005), Kinetics of the disproportionation of SnO1 Solid State Ionics 176, pp. 199207, Elsevier.

A. Köhler et al., "Fluorescence and Phosphorescence in Organic Materials", Advanced Engineering Materials, 2002, vol. 4, No. 7, pp. 453-459.

R.A. Mathies et al., "Optimization of High-Sensitivity Fluorescence Detection", Anal. Chem., 1990, vol. 62, pp. 17861791.

P.K.H. Ho et al., "All-Polymer Optoelectronic Devices", Science, vol. 285, Jul. 9, 1999, pp. 233236.

H. Aziz et al., "Degradation Mechanism of Small MoleculeBased Organic Light-Emitting Devices", Science, Mar. 19, 1999, vol. 283, pp. 1900-1902.

P.E. Burrows et al., "Reliability and degradation of organic light emitting devices", Appl. Phys. Lett., vol. 65, No. 23, Dec. 5, 1994, pp. 2922-2924.

P.A. Tick et al., "Optical Waveguides from Low Melting Temperature Glasses with Organic Dyes", SPIE, vol. 1775, Nonlinear Optical Properties of Organic Materials V, 1992, pp. 391-401.

Hood Chatham, "Oxygen Diffusion Barrier Properties of Transparent Oxide Coatings on Polymeric Substrates", Surface and Coatings Technology, vol. 78, 1996, pp. 1-9.

D.B. Curliss et al., "Cure Reaction Pathways of Bismaleimide Polymers: A Solid-State 15N NMR Investigation", Macromolecules, 1998, vol. 31, pp. 6776-6782.

A. Ashok Kumar et al., "Synthesis and Characterization of Siliconized Epoxy-1, 3-bis(maleimido)benzene Intercrosslinked Matrix Materials", Polymer, vol. 43, 2002, pp. 693-702.

M. Sava, "Synthesis of Bismaleimides with Ester Units and Their Polymerization with Diamines", Journal of Applied Polymer Science, vol. 84, 2002, pp. 750-757.

A.C. Misra et al., "Synthesis and properties of octafluoro-benzidine bis-maleimide and of it reaction products with fluorinated diamines", Polymer, 1992, vol. 33, No. 5, pp. 1083-1089.

A.C. Misra et al., "Synthesis and properties of some new fluorine-containing polyimides", Polymer, 1992, vol. 33, No. 5, pp. 1078-1082.

Liew, F.Y., et al., Investigation of the sites of dark spots in organic lightemitting devices. Applied Physics Letters, 1000. 77(17).

Forsythe, Eric, W., Operation of Organic-Based Light-Emitting Devices, in Society for Information Device (SID) 40th anniversary Seminar Lecture Notes, vol. 1, Seminar M5, Hynes Convention Center, Boston, MA, May 20 and 24, (1002).

PCT International Search Report for International Application No. PCT/US2006/030670 dated Dec. 19, 2006.

U.S. Appl. No. 11/509,445, filed Aug. 24, 2006 titled "Tin Phosphate Barrier Film, Method, and Apparatus".

Young, R., Flat panel display market outlook: From cyclicality to maturity, in NPD Breakfast with the Experts, D. Ross Young—President, ditor. 2006, DisplaySearch, www.displaysearch.com.

Nisato, G., et al., Evaluating high performance diffusion barriers: the calcium test. In 8th International Display Workshop. 2001. Nagoya, Japan.

Burrows, P.E., et al., Gas Permeation and Lifetime Tests on Polymer-Based Barrier Coatings, in SPIE Annual Meeting. 2000, SPIE.

Walther et al; "Multilayer Barrier Coating System Produced by Plasma-Impulse Chemical Vapor Deposition (PICVD)"; Surface and Coatings Technology, vo. 80, pp. 200-202, 1996.

Titova, Z.P. et al; 1964; Journal of Applied Chemistry USSR, 37 (10-12), pp. 2129.

N. Sakamoto, et al., "Properties and structure of glasses in the System $SnF_2$-$P_2O_5$", Journal of the Japan Institute of Metals, 1990, vol. 54, No. 12, pp. 1363-1368.

G.L. Graff, et al., "Barrier Layer Technology for Flexible Displays," Flexible Flat Panel Displays, 2005, John Wiley & Sons, Ltd., pp. 58-77.

X.J. Xu, et al., "Properties and structure of Sn-P-O-F glasses," Physics and Chemistry of Glasses, Oct. 1990, vol. 31, No. 5, pp. 183-187.

C.M. Shaw, et al., "Preparation and properties of stannous fluorophosphates glasses," Physics and Chemistry of Glasses, Apr. 1988, vol. 29, No. 2, pp. 49-53.

P.A. Tick, "Water durable glasses with ultra low melting temperatures," Physics and Chemistry of Glasses, Dec. 1984, vol. 25, No. 6, pp. 149-154.

US 9,050,622 B2

METHOD FOR INHIBITING OXYGEN AND MOISTURE DEGRADATION OF A DEVICE AND THE RESULTING DEVICE

RELATED APPLICATIONS

The present application is a continuation application and claims the priority benefit of pending U.S. application Ser. No. 11/207,691, filed Aug. 18, 2005, the entirety of which is incorporated herein by reference.

BACKGROUND OF THE INVENTION

1. Field of the Invention

The present invention relates to a method for inhibiting oxygen and moisture penetration, and subsequent degradation of a device and the resulting device. Examples of this device include a light-emitting device (e.g., organic emitting light diode (OLED) device), a photovoltaic device, a thin-film sensor, an evanescent waveguide sensor, a food container and a medicine container.

2. Description of Related Art

Transport of oxygen or water through laminated or encapsulated materials and subsequent attack of an inner material(s) represent two of the more common degradation mechanisms associated with many devices like for example light-emitting devices (OLED devices), thin-film sensors, and evanescent waveguide sensors. For a detailed discussion about the problems associated with oxygen and water penetration into the inner layers (cathode and electro-luminescent materials) of OLED and other devices, reference is made to the following documents:

Aziz, H., Popovic, Z. D., Hu, N. X., Hor, A. H., and Xu, G. "Degradation Mechanism of Small Molecule-Based Organic Light-Emitting Devices", Science, 283, pp. 1900-1902, (1999).

Burrows, P. E., Bulovic., V., Forrest, S. R., Sapochak, L. S., McCarty, D. M., Thompson, M. E. "Reliability and Degradation of Organic Light Emitting Devices", Applied Physics Letters, 65(23), pp. 2922-2924.

Chatham, H., "Review: Oxygen Diffusion Barrier Properties of Transparent Oxide Coatings on Polymeric Substrates", 78, pp. 1-9, (1996).

Unless something is done to minimize the penetration of oxygen or water into OLED devices, the lifetimes would be severely affected. Much effort has been expended to drive OLED operation towards 40 kilo-hour lifetimes, the levels generally regarded as necessary so OLED devices can overtake older display technologies as discussed in the following document:

Forsythe, Eric, W., "Operation of Organic-Based Light-Emitting Devices, in Society for Information Display (SID) 40th anniversary Seminar Lecture Notes, Vol. 1, Seminar M5, Hynes Convention Center, Boston, Mass., May 20 and 24, (2002).

The more prominent efforts to extend the lifetime of OLED devices include gettering, encapsulation and extensive device sealing techniques. Today one common way for sealing an OLED device is to use different types of epoxies, inorganic materials and/or organic materials that form a seal after they are cured by ultra-violet light, or heated by various means. For example, Vitex Systems manufactures and offers for sell a coating under the brand name of Barix™ which is a composite based approach where alternate layers of inorganic materials and organic materials are used to seal the entire surface of the OLED device. Although these types of seals provide some level of hermetic behavior, they can be very expensive and there are many instances in which they have failed to prevent the diffusion of oxygen and water into the OLED device under prolonged operation.

The same sort of oxygen and water penetration problem is common in other types of devices as well like, for example, thin-film sensors, evanescent waveguide sensors, food containers and medicine containers. Accordingly, there is a need to inhibit the penetration of oxygen and water into devices like, for example, OLED devices, thin-film sensors, evanescent waveguide sensors, food containers and medicine containers. This need and other needs are satisfied by the present invention.

BRIEF DESCRIPTION OF THE INVENTION

The present invention utilizes an LLT (low liquidus temperature) material, which typically has a low low liquidus temperature (or in specific embodiments a low glass transition temperature), to form a barrier layer on a device. The LLT material includes, but is not limited to, tin fluorophosphate glass, chalcogenide glass, tellurite glass and borate glass. The LLT material can be deposited onto the device by, for example, sputtering, co-evaporation, laser ablation, flash evaporation, spraying, pouring, frit-deposition, vapor-deposition, dip-coating, painting or rolling, spin-coating, or any combination thereof. Defects in the LLT material from the deposition step can be removed by a consolidation step (for example, heat treatment), to produce a pore-free, gas and moisture impenetrable protective coating on the device. Although many of the deposition methods are possible with common glasses (i.e. those having high melting temperatures), the consolidation step is only practical with the LLT material where the consolidation temperature is sufficiently low so as to not damage the inner layers in the device. In other embodiments, the deposition step and/or heat treatment step take place in a vacuum, or in an inert atmosphere, or in ambient conditions depending upon the LLT's composition.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Figure 1:
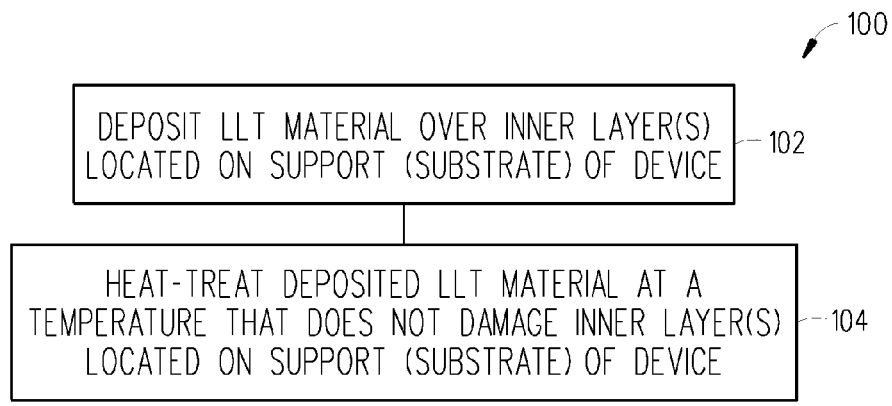
FIG. 1 is a flowchart illustrating the steps of a method for inhibiting oxygen and moisture degradation of a device in accordance with the present invention.
Figure 2:
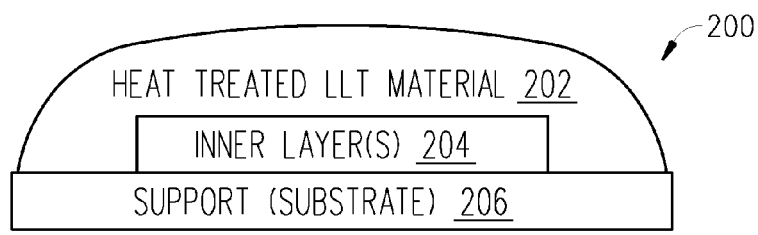
FIG. 2 is a cross-sectional side view of the device that is protected by LLT material applied by the method shown in FIG. 1 in accordance with the present invention.

Referring to FIGS. 1-2, there are respectively illustrated a flowchart of a method 100 for inhibiting oxygen and moisture degradation of a device 200 and a cross-sectional side view of the protected device 200. As described below, the device 200 includes a heat treated low liquidus temperature (LLT) material 202, one or more inner layers 204 and a support 206. And, the method 100 includes step 102 in which the LLT material 202 is deposited over one or more inner layers 204 located on top of the support 206 (e.g., substrate 206)(see also FIG. 5).

The LLT material 202 can be deposited using anyone of variety of processes including, for example, sputtering, flash evaporation, spraying, pouring, frit-deposition, vapor-deposition, dip-coating, painting, rolling (for example a film LLT material 202), spin-coating, a co-evaporation, a laser ablation process, or any combination thereof. Alternatively, more than one type of LLT material 202 can be deposited (e.g., sputtered) at the same time over one or more inner layers 204 located on top of the support 206 (e.g., substrate 206). Moreover, multiple layers of the same or different types of LLT material 202 can be deposited (e.g., sputtered) over one or more inner layers 204 located on top of the support 206 (e.g., substrate 206). The method 100 also includes step 104 in which the device 200 including the deposited LLT material 202 is annealed, consolidated or heat treated. The heat treatment step 104 is performed to remove defects (e.g., pores) within the LLT material 202 which were formed during the deposition step 102. Some examples of different devices 200 that can be protected by the heat treated LLT material 202 include a light-emitting device (e.g., OLED device), a photovoltaic device, a thin-film sensor, an evanescent waveguide sensor, a food container and a medicine container. The deposition step 102 and the heat treatment step 104 can be performed in a vacuum or inert atmosphere. This is done to ensure that the water-less and oxygen-free condition is maintained throughout the sealing process. This is especially important for robust, long-life operation of organic electronics with minimal degradation.

In one embodiment, the device 202 is an OLED device 200 that has multiple inner layers 204 which include a cathode and electro-luminescent materials that are located on the substrate 206. The cathode and electro-luminescent materials 204 can be easily damaged if they are heated above for example 100-125° C. As such, the heat treatment step 104 (so as to minimize or eliminate porosity) would not be possible in this particular application if traditional glass was deposited on the OLED device 200. Because, the temperature (e.g., 600° C.) needed to remove the defects in a traditional glass (soda-lime) would be so high that the OLED device's inner layers 204 would be damaged. However, in the present invention, the heat treatment step 104 can be performed in this particular application because the temperature (e.g., 120° C.) needed to remove the defects in the LLT material 202 can be relatively low such that the OLED device's inner layers 204 would not be damaged.

The use of LLT material 202 makes this all possible because this type of material has a relatively low liquidus temperature ≤1000° C. The low liquidus temperature means that the LLT 202 can be heat treated at a relatively low temperature to obtain a pore-free film which will not thermally damage the OLED device's inner layer(s) 204. Again, it should be appreciated that the heat treated LLT material 202 can also be used as a barrier layer on a wide variety of devices 200 in addition to the OLED device 202 such as a thin-film sensor, a photovoltaic device, an evanescent waveguide sensor, a food container, a medicine container or an electronic device that is sensitive to moisture, oxygen or other gases (for example).

In the preferred embodiment, the LLT material 202 has low liquidus temperature ≤1000° C. (and more preferably ≤600° C. and even more preferably ≤400° C.) and can include, for example, glass such as tin fluorophosphate glass, chalcogenide glass, tellurite glass, borate glass and phosphate glass (e.g., alkali Zn or SnZn pyrophosphates). These LLT materials 202 are desirable for several reasons including (for example):

The low liquidus temperature (LLT) materials can be devoid of heavy metals and other environmentally undesirable materials.

The LLT materials can be durable and exhibit low dissolution rates when immersed in water at 85° C. (<20 microns per day). See, Tick, P. A., "Water Durable Glasses with Ultra Low Melting Temperatures", Physics and Chemistry of Glasses, 25(6) pp. 149-154 (1984).

The LLT material can contain dye molecules and can be doped to levels as high as 8 mM ($4.8 \times 10^{18}$ cm$^{-3}$). See, Tick, P. A., Hall, D. W., "Nonlinear Optical Effects in Organically Doped Low Melting Glasses", Diffusion and Defect Data, Vol. 53-54, pp. 179-188, (1987).

The LLT phosphate glasses have helium permeability coefficients 4 to 5 orders of magnitude less than that of fused silica. See, Peter, K. H., Ho, D., Thomas, S., Friend, R. H., Tessler, N. "All-Polymer Optoelectronic Devices", Science, 285, pp. 233-236, (199).

The tin fluorophosphate glass 202 is discussed first and the preferred composition ranges of the various constituents (in parts by weight) are indicated in TABLE 1.

TABLE 1

| | tin fluorophosphate glass 202* |
|---|---|
| Sn | 20-85 wt % |
| P | 2-20 wt % |
| O | 10-36 wt % |
| F | 10-36 wt % |
| Nb | 0-5 wt % |

*at least 75% total of Sn + P + O + F.

For a detailed discussion about tin fluorophosphate glass 202, reference is made to the following documents:

U.S. Pat. No. 4,314,031.

U.S. Pat. No. 4,379,070.

Tick, P. A., Weidman, D. L., "Optical Waveguides from Low Melting Temperature Glasses with Organic Dyes", in Proceedings of SPIE—The International Society for Optical Engineering—Nonlinear Optical Properties of Organic Materials V, pp. 391-401, (1993).

Tick, P. A., "Water Durable Glasses with Ultra Low Melting Temperatures", Physics and Chemistry of Glasses, 25(6) pp. 149-154 (1984).

Tick, P. A., Hall, D. W., "Nonlinear Optical Effects in Organically Doped Low Melting Glasses", Diffusion and Defect Data, Vol. 53-54, pp. 179-188, (1987).

The contents of these documents are incorporated by reference herein.

Three different tin fluorophosphate glasses 202 (composition nos. 1-3), one tellurite glass 202 (composition no. 4) and one borate glass 202 (composition no. 5) have been tested. Details about these tested LLT glasses 202 and the results and conclusions from those experiments are described next. TABLES 2A and 2B illustrate the compositions of the tested exemplary LLT glasses 202 with their $T_G$ (in this example and other examples herein $T_G$ is related to the low liquidus temperature) and various constituents as follows:

TABLE 2A

| (atomic (or element) percent) | | | | | |
|---|---|---|---|---|---|
| | tin fluoro-phosphate glass (Comp. #1) | tin fluoro-phosphate glass (Comp. #2) | tin fluoro-phosphate glass (Comp. #3) | tellurite glass (Comp. #4) | borate glass (Comp. #5) |
| Sn | 22.42 | 18.68 | 23.6 | — | — |
| P | 11.48 | 11.13 | 11.8 | — | — |
| O | 42.41 | 38.08 | 41.4 | 66.67 | 58.8 |
| Pb | — | 3.04 | — | — | — |
| F | 22.64 | 28.05 | 23.3 | — | — |
| Nb | 1.05 | 1.02 | — | — | — |
| Ta | — | — | — | 3.33 | — |
| Ga | — | — | — | 3.33 | — |
| Te | — | — | — | 26.67 | — |
| Bi | — | — | — | — | 25.9 |
| Zn | — | — | — | — | 5.88 |
| B | — | — | — | — | 9.41 |
| $T_G$ | 130° C. | 131° C. | 100° C. | 360° C. | 340° C. |

TABLE 2B

| (mole percent) | | | | |
|---|---|---|---|---|
| Comp. #1 | 39.6 $SnF_2$ | 38.7 SnO | 19.9 $P_2O_5$ | 1.8 $Nb_2O_5$ |
| Comp. #2 | 39.5 $SnF_2$ | 27.7 SnO | 20.0 $P_2O_5$ | 1.8 $Nb_2O_5$ 10.9 $PbF_2$ |
| Comp. #3 | 39.5 $SnF_2$ | 40.5 SnO | 20.0 $P_2O_5$ | — |
| Comp. #4 | 5.66 $Ta_2O_5$ | 5.66 $Ga_2O_3$ | 88.9 $TeO_2$ | — |
| Comp. #5 | 55 $Bi_2O_3$ | 25 ZnO | 20 $B_2O_3$ | — |

Figure 3:
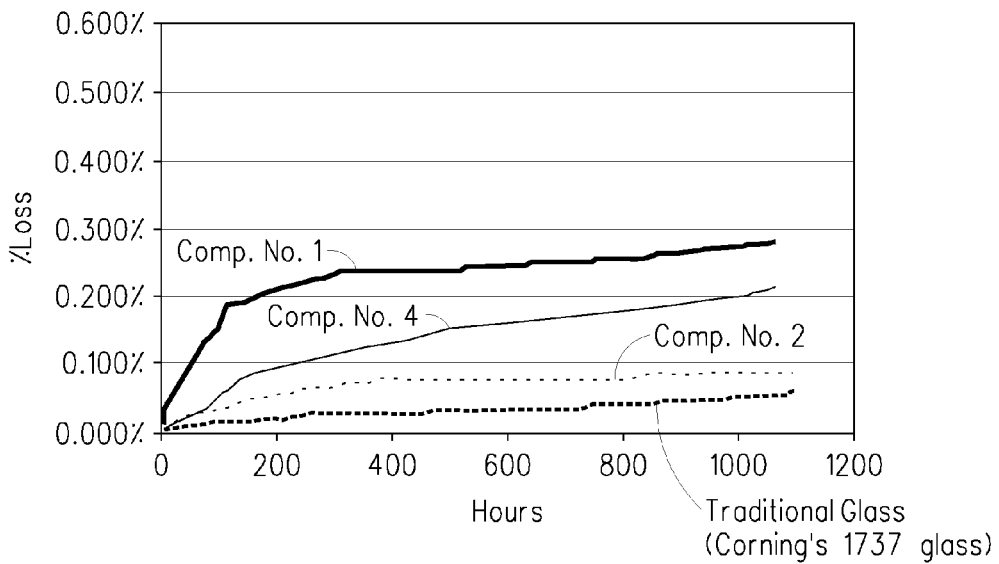
FIGS. 3-9B illustrate several different graphs, photos and diagrams that are used to help explain the different experiments and the results of the different experiments which were conducted to demonstrate the capabilities and advantages of the present invention.
Figure 4:
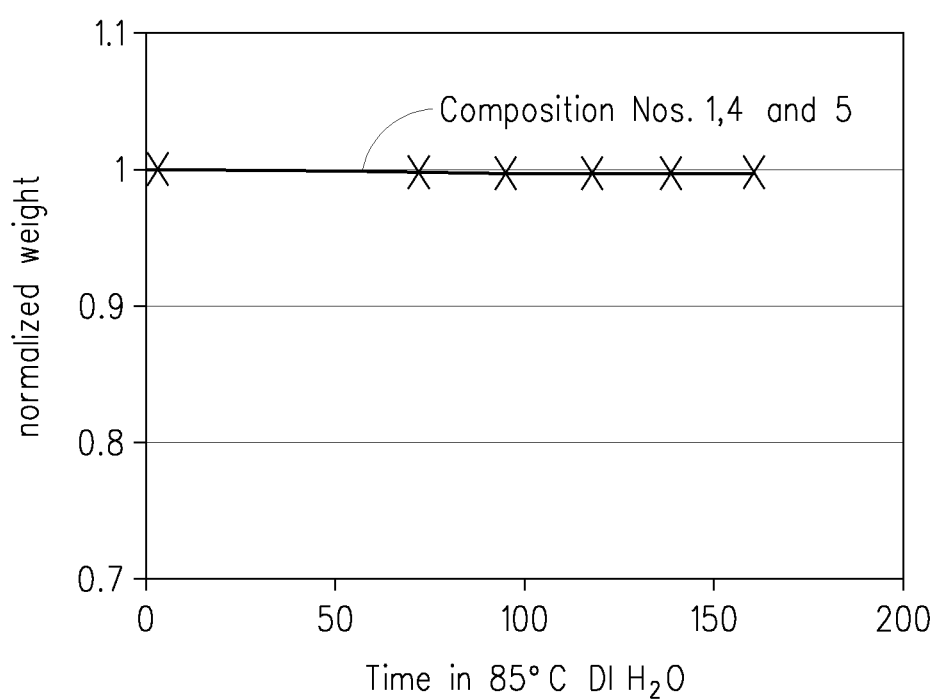

The tested LLT glasses 202 are durable as indicated in FIGS. 3 and 4. FIG. 3 is a graph that illustrates the results of a weight loss experiment that was conducted for 1000 hours in 85° C. water. As can be seen, the tested LLT glasses 202 (composition nos. 1, 2 and 4) have a durability that is comparable to Corning Inc.'s 1737 glass (traditional glass). FIG. 4 is a graph that indicates that the weight loss measurements of the tested LLT glasses 202 (composition nos. 1 and 4-5).

Figure 5:
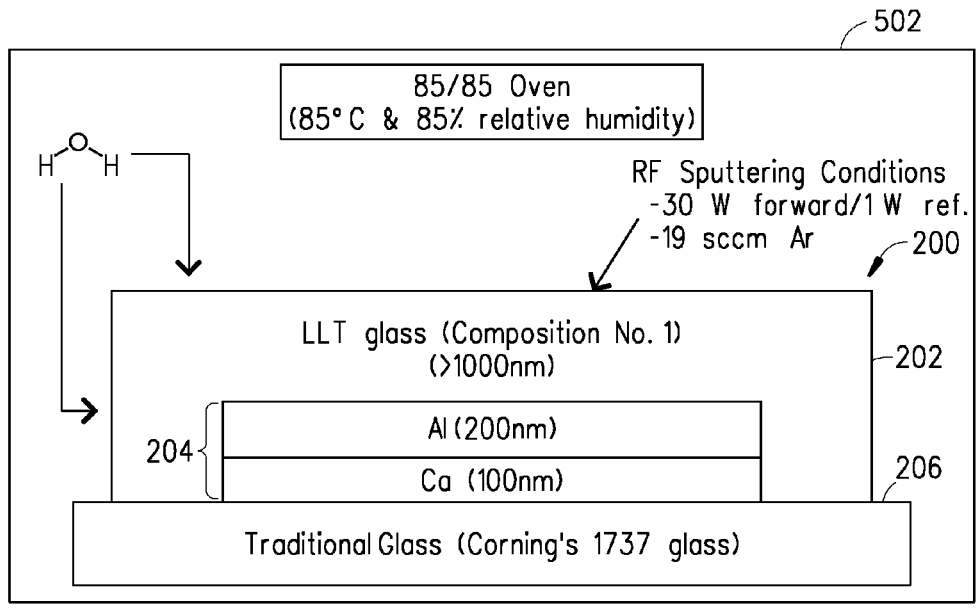

A "calcium patch" experiment was also performed and the resulting experimental data are discussed next to illustrate the low permeability of oxygen and water through one of the aforementioned LLT glass film layers 202 (composition no. 1). FIG. 5 is a cross-sectional side view of an oven 502 which contains a device 200 that includes LLT glass films 202 (composition no. 1), two inner layers 204 (Al and Ca) and a substrate 206 (Corning Inc.'s 1737 glass substrate). The Al and Ca layers 204 were deposited on the thick substrate 206 and then encapsulated with LLT glass films 202 (composition no. 1). During this experiment, several of these devices 200 were placed within the oven 502 and subjected to environmental aging at a fixed temperature and humidity, typically 85° C. and 85% relative humidity ("85/85 testing"). In each tested device 200, the Ca layer 204 was initially a highly reflecting metallic mirror. And, if water and oxygen penetrated the top encapsulation layer of LIT glass films 202, then the metallic Ca 204 reacted and turned into an opaque white flaky crust which could be quantified with an optical measurement (see FIGS. 6 and 7).

More specifically, the "calcium patch" test was performed as follows. A 100 nm Ca film 204 was evaporated onto a Corning Inc.'s 1737 glass substrate 206. Then, a 200 nm Al layer 204 was evaporated on the Ca film 204. The Al layer 204 was used to simulate the conditions of a cathode typically used to produce polymer light emitting diodes (PLEDs). Using a "dual-boat" customized Cressington evaporator, the 1737 glass substrate 206 was maintained at 130° C. and approximately $10^{-6}$ Torr during the Ca and Al evaporation steps. After cooling to room temperature, the vacuum was broken and then the calcium patch was extracted and carried in a vacuum dessicator to an RF sputtering vacuum system, and pumped overnight back to $10^{-6}$ Torr. The LLT glass 202 (composition no. 1) was then sputtered onto the Al and Ca layers 204 under relatively gentle RF power deposition conditions (30 W forward/1 W reflected RF power) and low argon pressure (~19 sccm)(see step 102 in FIG. 1). The sputtering was performed for 24 hours to obtain a glass thickness in the range of 2.5 μm (chamber pressure ~$10^{-3}$ Torr). It should be noted that the LLT material thickness can be made as thick as one needs depending on one's chosen deposition duration. Then, some of the newly created devices 200 were heated to ~121° C. by an infrared lamp which was mounted in the vacuum chamber to consolidate the sputtered LLT glass layers 202 (see step 104 in FIG. 1) (see top row of pictures in FIG. 6). Upon cooling, the vacuum was broken and the heat-treated devices 200 and the non-heat-treated devices 200 were placed in a humidity chamber and held at 85° C. and 85% relative humidity. During this period, pictures where taken at regular time intervals to quantify the evolution of the tested devices 202. An illustration of the changes to the calcium film in the tested devices 200, prepared under slightly different conditions is shown in FIG. 6.

Figure 6:
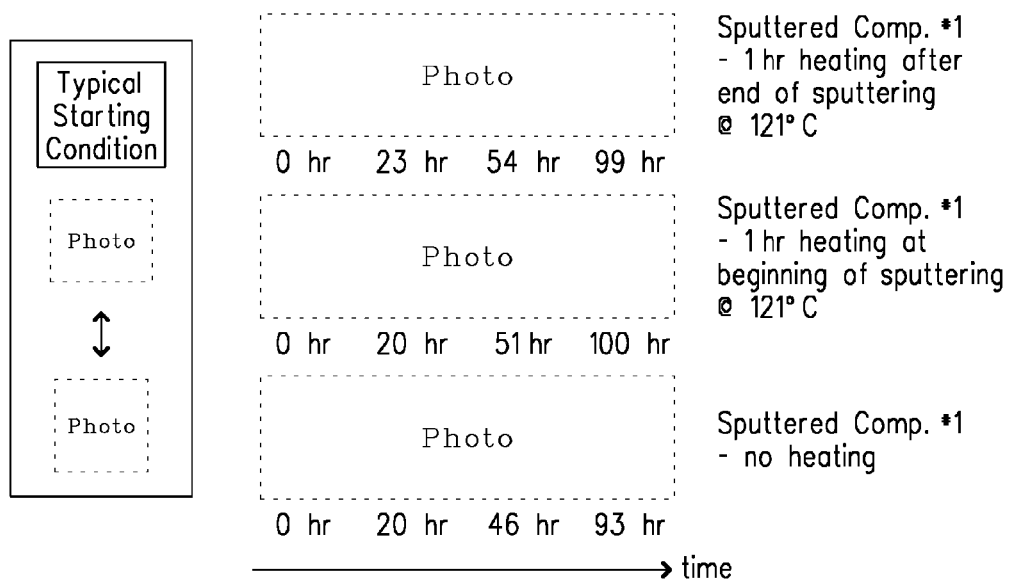

FIG. 6 shows the pictures of the tested devices 200 which were taken at regular intervals to follow the rate of calcium oxidation which is an indication of the permeation properties of the LTG glass films 202. The left panel in FIG. 6, labeled "Typical Starting Condition", shows the initial metallic Ca layers 204 of tested devices 200 before oxidation reactions associated with this test occurred (i.e., $Ca_+2H_2O \rightarrow Ca(OH)_2 + H_2$, and $2Ca + O_2 \rightarrow 2CaO$). The images in the bottom row were taken, at the indicated time intervals, of a sample device 200 prepared without any heating of the LLT glass sputtered glass layer 202. The images in the middle row were taken of a similar device 200 that was heated (at 121° C.) during the first hour of the 24 hour glass deposition time interval. And, the tested device 200 shown in the top row was prepared similarly except that it was heated (at 121° C.) after the 24 hour glass deposition time interval. Clearly, the tested device 200 shown in the top row that had the entire LTG glass thickness subjected to heat-treatment fended off oxygen and water attack best.

Figure 7:
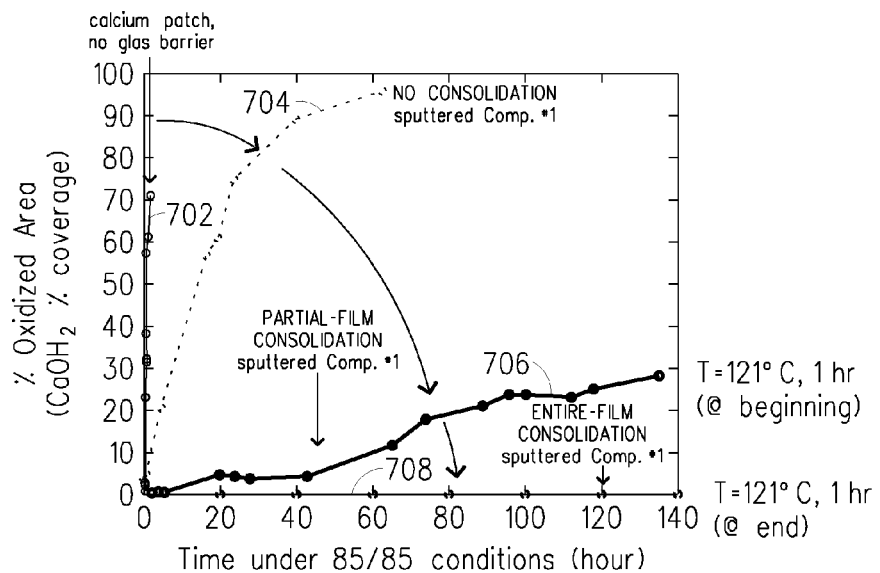

The photos of FIG. 6 were quantified by calculating the percentage of area that turned to a "white flaky crust" versus the percentage of area that maintained a "silvery metallic finish" and the calculated values were plotted as a function of time (see FIG. 7). FIG. 7 is a graph that illustrates the percentage of calcium area oxidized due to time spent in the 85° C. and 85% relative humidity oven 502 for the three tested devices 200 (see FIG. 6) and one non-covered device. As shown, data 702 represents the percentage of the calcium patch surface area that was oxidized on a calcium patch that had the 100 nm calcium and 200 nm aluminum layers but was not coated with LLT glass 202. And, data 704 represents the calcium patch surface area that was oxidized in one of the tested devices 200 which had a 2.5 μm sputtered LLT glass layer 202 (composition no. 1) that was not heat treated. Data 706 represents the calcium patch surface area that was oxidized in another tested device 200 which had a 2.5 μm sputtered LLT glass layer 202 (composition no. 1) that was heat treated at 121° C. for the first hour during the 24 hour deposition period. Lastly, data 708 represents the calcium patch surface area that was oxidized in another test device 200 which had a 2.5 μm sputtered LLT glass layer 202 (composition no. 1) that was heat treated at 121° C. for one hour after the 24 hour deposition period. As can be seen, the device 200 that was heat treated after the deposition period performed the best.

To generate this graph, LabView™ code was written to process the successive images shown in FIG. 6 of each tested device 200 during time spent in the 85/85 oven 502. The "first image" on the left side of FIG. 6, before the tested device 200 was placed in the humidity oven, served as the reference baseline from which a threshold was calculated. The threshold was assigned by choosing the first minimum pixel intensity value that occurred after the main peak, or "hump", in the histogram of the first image. Data pixels, in later images, were deemed "calcium oxidized" if their pixel value exceeded this threshold. The fraction of area, deemed "calcium oxidized", at any given time in the oven 502, is plotted in FIG. 7. Clearly, the tested device 200 with the LLT glass 202 (composition no. 1) that was heat treated at 121° C. after the 24 hour film deposition step exhibited the best impermeability for moisture and oxygen. As can be seen, this experiment has demonstrated that physically deposited low $T_G$ glass thin-film layers 202 can be gently "annealed" to restore the essentially pore-free barrier layer.

Figure 8:
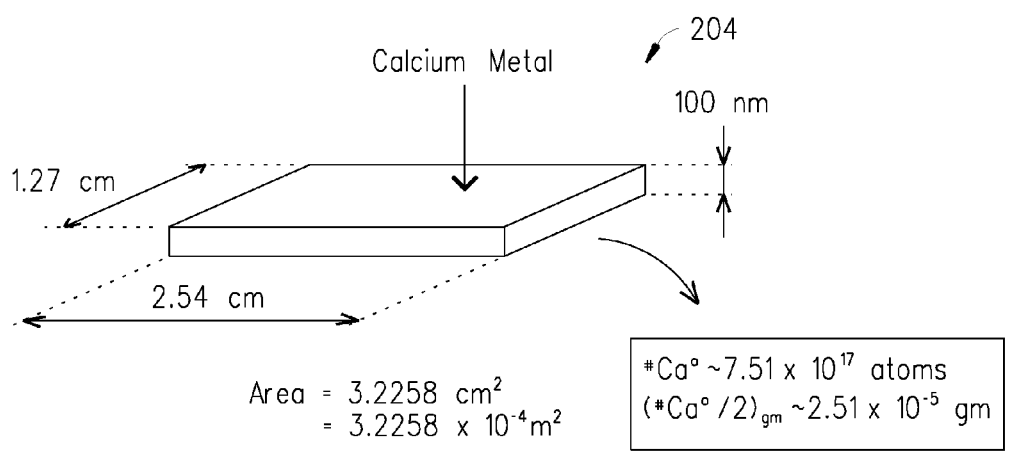

Next, we describe how the water permeation rates of the tested devices 200 were estimated with the aid of TABLE 3 and FIG. 8. The water permeation rate in the tested devices 200 were estimated by first calculating the total amount of calcium metal in the 100 nm layer 204. Then, by consulting FIG. 7 and other additional data, we estimated the time it took for half the calcium in the ½"×1"×100 nm patch to become oxidized, the so-called half life. This yields the average number of grams oxidized with water vapor per day, per unit meter$^2$ in an 85/85 environment. To convert to ambient conditions, a scale factor was introduced between the ambient time (ambient half life) and time spent in the 85/85 environment (85/85 half life). To determine this scale factor, we used a calcium patch made with calcium and aluminum layers alone and placed half in the 85/85 oven 502, and the other half was left out in atmosphere. The time (1.2 hours) it took the half of the calcium patch that was placed in the oven to oxidize versus the time (163 hours) it took the half left out in the atmosphere to oxidize enabled us to estimate the scale factor required to convert the measured permeation rates to ambient conditions. These values are shown in the underlined section in TABLE 3.

TABLE 3

|  | Half-life time to half coverage | 85/85 permeation rate (measured) | ambient permeation rate (calculated) |
|---|---|---|---|
| no glass cover | 163 hr | $1.1 \times 10^{-2}$ | $1.1 \times 10^{-2}$ |
| no glass cover* | 1.2 hr | 1.6 | $1.1 \times 10^{-2}$ |
| comp. no. 1 (no heating)* | 16 hr | $1.2 \times 10^{-1}$ | $\underline{8.6 \times 10^{-4}}$ |
| comp. no. 1 little heating* | ≈320 hr | $5.8 \times 10^{-3}$ | $\underline{4.3 \times 10^{-5}}$ |
| comp. no. 1 more heating of structure* | ~1250 hr | $1.5 \times 10^{-3}$ | $\underline{1.1 \times 10^{-5}}$ |

*Heated in a "85/85" environment.

Figure 9A:
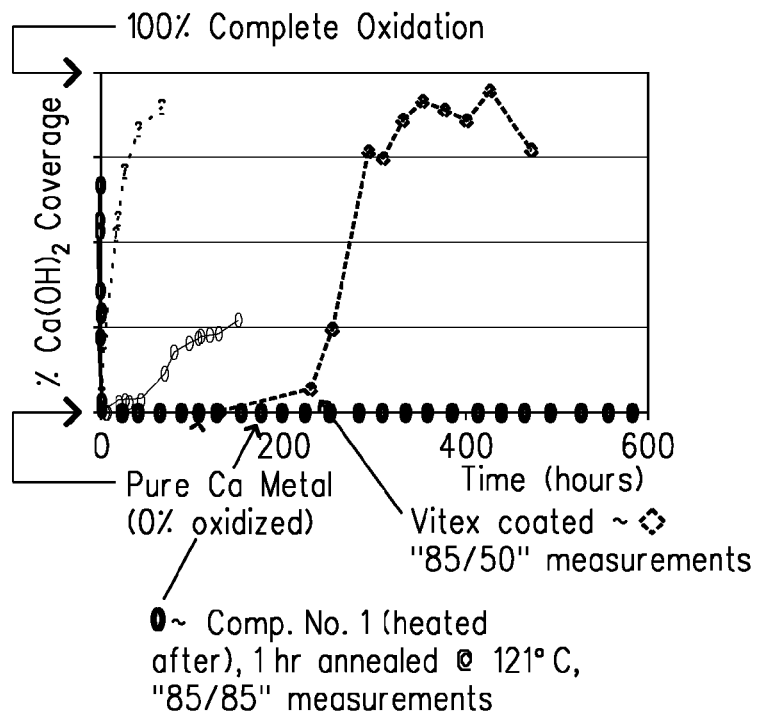
Figure 9B:
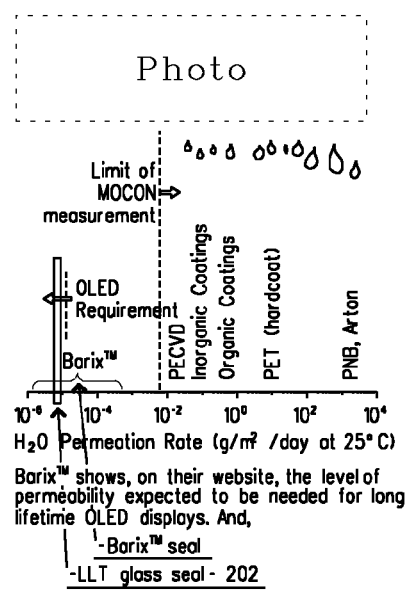

These values may be illustrated graphically and compared with traditional seals like Vitex system's Barix™ seals as shown in FIGS. 9A and 9B. The data associated with the tested device 200 that had LLT glass 204 (composition no. 1) which was heat treated after the deposition step is shown in FIGS. 9A and 9B. Also, shown is data associated with Vitex system's Barix™ seals. As can be seen, the tested device 200 performed better than the device that used a Barix™ seal. It should be noted that the photograph/graph in FIG. 9B also shows the relative levels of oxygen permeability of typical polymers and coatings and the sensitivity limits of current test equipment.

From the foregoing, it can be readily appreciated by those skilled in the art that the present invention utilizes LLT materials which have low liquidus temperatures to form a barrier layer with permeation properties comparable to the material itself. The LLT materials include, but are not limited to, tin fluorophosphate glass, chalcogenide glass, tellurite glass, phosphate glass and borate glass. These LLT materials are especially suitable for inhibiting oxygen or/and moisture degradation common to electronic devices, food or medicine. In addition, these LLT materials may be used to reduce, for example, photochemical, hydrolytic, and oxidative damage due to chemically active permeants. The LLT materials may be deposited using one or more of the following methods such as sputtering, evaporation, spraying, pouring, frit-deposition, vapor-deposition, dip-coating, painting or rolling, spin-coating (for example). Defects in the LLT materials from the deposition step are removed by a consolidation step (heat treatment) in order to produce a pore-free, gas and moisture impenetrable protective coating on the device. The barrier layer is quite durable, exhibiting low weight loss (0.28%) in standardized 1000 hour, 85° C. water-immersion tests, and enduring over 600 hours in calcium patch tests, in 85° C. and 85% relative humidity chambers. Although many of the deposition methods are possible with common glasses (i.e. high melting temperature), the consolidation step is truly practical with the LLT materials where the consolidation temperature is sufficiently low to inhibit thermal damage to nearby layers.

In recent experiments that have been conducted, it has been shown that with a certain type of LLT material 202 namely the tin fluorophosphates material it can have a higher Tg (and different stoichiometric composition) after it has been deposited (sputtered) as a film and after that sputtered film has been heat-treated. A description is provided next to discuss a theory as to why the Tg (and stoichiometric composition) is different between the starting LLT material and both the sputtered (deposited) film and the heat-treated sputtered film. Basically, in this experiment it has been found the original composition no. 1 glass target has all divalent tin (i.e., $Sn^{2+}$). While, the sputter-deposited thin film material is composed of 66% $Sn^{4+}$ and 34% $Sn^{2+}$. Now when this sputter-deposited thin film material is heated at 120° C. for one hour in vacuum, the tin oxidation state is driven to 100% tetravalent tin (i.e., $Sn^{4+}$). It is believed these differences in the Sn changes the stoichiometric composition and as a result the Tg of the deposited and heat treated composition no. 1 film.

It should be understood that this change in LT appears to happen with the tin fluorophosphates material and not with the tellurite and borate films which have the same Tg as the starting targets. Moreover, a tin-pyrophosphate glass ($Sn_2P_2O_7$) was tested to see if the Tg changed between the sputtered (deposited) film and the heat-treated sputtered film. In this test, tin pyrophosphate powder was put it into an evaporative heating boat in a vacuum chamber and pumped down to a 10^-6 Torr vacuum. The boat was then heated to approximately 80 Watts before we started evaporating the material onto a substrate. The deposited material was then heated at 120° C. for one hour in vacuum. Then, a hermeticity experiment was conducted on the resulting film and it was found that the stoichiometric composition of the material was maintained through-out the entire process. This includes the both the deposited film and the heated-deposited-film.

It has also been shown herein that barrier layers containing a subset of durable low liquidus temperature materials provide substantial protection from oxygen and water attack (and transport) beyond traditional physically-deposited oxide barrier layers. For instance, the preferred barrier layers described herein can have a water and oxygen permeance below $10^{-6}$ g/m$^2$/day and $10^{-5}$ cc/m$^2$/atm/day, respectively. Furthermore, it has been shown that physically-deposited low liquidus temperature thin-film barrier layers can be annealed at temperatures suitable for retaining the integrity of adjoining organic layer material physicochemical properties. This last feature makes durable low liquidus temperature materials unique compared with other physically deposited oxide barrier layers. These low liquidus temperature materials can be annealed at a low temperature so as to remove mesoscopic defects from the physically deposited layers and also retain the physicochemical properties of the adjoining organic under-layers. This is in contrast to the Vitex™ method in which the defects are not removed. Moreover, it has been shown that these low liquidus temperature barrier layers can be used to form an integral part of various devices (e.g., waveguide, grating sensors, photonic crystals etc.) while inhibiting the transport of materials detrimental to high-performance operation.

Even though specific types of tin fluorophosphate glass, borate glass and tellurite glass are discussed and described in detail herein, it should be appreciated that other types of LLT materials may also be used in accordance with the present invention. It should also be appreciated that low liquidus temperature materials can be made which contain small-composite materials or other electro-optic dopants. These dopants can optimize the refractive indices or add additional electro-optic features to a device 200. This can be particularly, useful when the device 200 is a waveguide sensor.

Although several embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A method for sealing a device comprising the steps of:
   depositing a starting low liquidus temperature inorganic material over at least a portion of said device; and
   heat treating said deposited low liquidus temperature inorganic material that is deposited over said at least a portion of said device in an oxygen and water free environment,
   wherein said heat treating step is performed in a vacuum or an inert environment and at a temperature which does not damage components in said device.

2. The method of claim 1, wherein the deposited low liquidus temperature inorganic material and the heat treated low liquidus temperature inorganic material have a higher low liquidus temperature than the starting low liquidus temperature inorganic material.

3. The method of claim 1, wherein the deposited low liquidus temperature inorganic material and the heat treated low liquidus temperature inorganic material have a same low liquidus temperature as the starting low liquidus temperature inorganic material.

4. The method of claim 1, wherein said low liquidus temperature inorganic material is a tin-fluorophosphate material.

5. The method of claim 4, wherein said tin-fluorophosphate material has the following composition:
   Sn (20-85 wt %);
   P (2-20 wt %);
   O (10-36 wt %);
   F (10-36 wt %);
   Nb (0-5 wt %); and
   at least 75% total of Sn+P+O+F.

6. The method of claim 1, wherein said low liquidus temperature inorganic material is one of the following, or any combination thereof:
   tin-fluorophosphate material;
   chalcogenide material;
   tellurite material;
   borate material; and
   phosphate material.

7. The method of claim 1, wherein said low liquidus temperature inorganic material has a liquidus temperature ≤1000° C.

8. The method of claim 1, wherein said low liquidus temperature inorganic material has a liquidus temperature ≤600° C.

9. The method of claim 1, wherein said low liquidus temperature inorganic material has a liquidus temperature ≤400° C.

10. The method of claim 1, wherein said low liquidus temperature inorganic material is one of the following, or any combination thereof:
    chalcogenide material;
    tellurite material; and
    borate material.

11. The method of claim 1, wherein said low liquidus temperature inorganic material is one of the following, or any combination thereof:
    tellurite material; and
    borate material.

12. A method for sealing a device comprising the steps of:
    depositing a starting low liquidus temperature inorganic material over at least a portion of said device; and
    heat treating said deposited low liquidus temperature inorganic material that is deposited over said at least a portion of said device in an oxygen and water free environment,
    wherein said heat treating step is performed in a vacuum or an inert environment and at a temperature which does not damage components in said device,
    wherein said low liquidus temperature inorganic material is a tin-fluorophosphate material having the following composition: Sn (20-85 wt %), P (2-20 wt %), O (10-36 wt %), F (10-36 wt %), Nb (0-5 wt %), and at least 75% total of Sn+P+O+F, and
    wherein said low liquidus temperature inorganic material has a liquidus temperature ≤1000° C.

* * * * *